US005455792A

United States Patent [19]
Yi

[11] Patent Number: 5,455,792
[45] Date of Patent: Oct. 3, 1995

[54] FLASH EEPROM DEVICES EMPLOYING MID CHANNEL INJECTION

[76] Inventor: Yong-Wan Yi, 11741 Sierra Spring Ct., Cupertino, Calif. 95014

[21] Appl. No.: 303,361

[22] Filed: Sep. 9, 1994

[51] Int. Cl.$^6$ ................................................. G11C 16/04
[52] U.S. Cl. .................... 365/185.12; 257/316; 257/319; 257/322; 257/345; 257/404
[58] Field of Search ..................... 365/185, 218; 257/316, 319, 322, 345, 404

[56] References Cited

U.S. PATENT DOCUMENTS

| | | | |
|---|---|---|---|
| 4,203,158 | 5/1980 | Frohman-Bentchkowsky | 365/185 |
| 4,412,311 | 10/1983 | Miccoli et al. | 365/185 |
| 4,558,344 | 12/1985 | Perlegos | 357/59 |
| 4,698,787 | 10/1987 | Mukherjee et al. | 365/185 |
| 4,701,776 | 10/1987 | Perlegos et al. | 357/23.5 |
| 4,783,766 | 11/1988 | Samachisa et al. | 365/185 |
| 4,794,565 | 12/1988 | Wu et al. | 365/185 |
| 4,795,719 | 1/1989 | Eitan | 437/43 |
| 5,029,130 | 7/1991 | Yeh | 365/185 |
| 5,036,378 | 7/1991 | Lu et al. | 357/23.5 |
| 5,095,344 | 3/1992 | Harari | 357/23.5 |
| 5,280,446 | 1/1994 | Ma et al. | 365/185 |
| 5,284,784 | 2/1994 | Manley | 365/185 |

OTHER PUBLICATIONS

S. Sze, "Physics of Semiconductor Devices, Second Edition," ©1981 John Wiley & Sons, Inc., TK7871.85.S988 1981, p. 78.

F. Masuoka et al., "A New Flash E$^2$PROM Cell Using Triple Polysilicon Technology", 1984 IEDM Technical Digest, pp. 464–467.

A. T. Wu et al., "A Novel High–Speed, 5–Volt Programming EPROM Structure with Source–Side Injection", 1986 IEDM Technical Digest, pp. 584–587.

K. Naruke et al., "A New Flash–Erase EEPROM Cell with a Side–Wall Select–Gate on Its Source Side", 1989 IEDM Technical Digest, pp. 603–606.

Primary Examiner—Joseph E. Clawson, Jr.

[57] ABSTRACT

A flash electrically erasable programmable read only memory (EEPROM) device includes a two-dimensional array of single transistor non-volatile memory cells having the mid channel injection mechanism. The single transistor non-volatile memory cell includes a select gate, a control gate, and a floating gate which are disposed above a channel between a source and a drain. The control gate is located above the floating gate. In order to program the memory cell, the carrier injection into the floating gate is accomplished by the deflection of accelerated carriers from the middle region of the channel. Carriers are accelerated through the carrier acceleration passage by the horizontal component of the stray electric field, and deflected by the vertical component of the electric field. The erasure of memory cell is accomplished by the tunneling of carriers from the floating gate to the drain. Two types of array connection methods are proposed to optimize the flash mid channel injection EEPROM device either for high speed applications or for high density applications.

11 Claims, 8 Drawing Sheets

FLASH EEPROM DEVICES EMPLOYING MID CHANNEL INJECTION

FIELD OF THE INVENTION

The present invention relates to non-volatile semiconductor memory devices in general and more particularly to a single transistor electrically erasable programmable read-only memory (EEPROM) cell and array structures including programmable and erasable floating gate storage devices.

BACKGROUND OF THE INVENTION

The flash EEPROM (Electrically Erasable Programmable Read Only Memory) device is an advanced type of EEPROM which can be erased electrically in high speeds without being removed from the circuit board. Prior to reprogramming, the conventional EPROM (Electrically Programmable Read Only Memory) device must be removed from the circuit board and exposed to ultraviolet light for about 20 minutes in a special apparatus in order to be erased. As the flash EEPROM does not need such a time consuming erase procedure, it is more convenient to use. Also, the flash EEPROMs can cost less than the EPROMs since they do not require the costly erase handling and the time delays for the erasure in the mass production environment, and do not use the expensive quartz-window ceramic packages commonly used in EPROMs. Despite these advantages over EPROMs, the prior art EEPROMs had several disadvantages, such as large chip size and the over-erase problem. Therefore, constant improvements had been made for prior art EEPROMs with different approaches and implementations, which include stacked gate cells, two-transistor cells, split gate cells, source side injection cells, and other types of EEPROM cells.

The first stacked gate EEPROM cell implemented in a single transistor was disclosed by Frohman-Bentchkowsky et al. in U.S. Pat. No. 4,203,158 issued May 13, 1980. This cell consisted of a double-poly stacked gate structure with a thin oxide area which was used for both erasing and programming by the Fowler-Nordheim tunneling phenomenon. Another stacked gate cell was proposed by Mukherjee et al. in U.S. Pat. No. 4,698,787 issued Oct. 6, 1987. The Mukherjee prior an cell shown in FIG. I employs the channel hot electron injection for the programming at the drain side, and Fowler-Nordheim tunneling for erasing at the source side. Although the stacked gate cell results in a minimum cell size comparable to the conventional EPROM cell, it has a major disadvantage called the over-erase problem.

The over-erase problem occurs in stacked gate cells when the floating gate in FIG. 1 is overly discharged during the erase operation. The threshold voltages of over-erased cells are negative and such cells conduct current even when they are not selected by a read voltage applied to the control gate. If one or a few of the cells in a column (or row) of the cell array were over-erased and constantly conducting leakage currents, then the whole column (or row) of the cells will have malfunctions because the sense amplifier can not detect the correct data from the selected cell in the column (or row).

In order to get around this over-erase problem, the stacked gate EEPROM devices are usually erased by a time consuming iteration algorithm instead of being erased at once. During the erase operation, such an iteration algorithm will read and test out each byte of cells in order to make sure that cells are not over-erased after each small incremental step of erasing is performed. This iteration is repeated until all the cells in the device are properly erased. Presently a commercial one mega bit flash EEPROM device having the stacked gate cells takes more than 2 seconds for erasing, or a minimum of 5 seconds for erasing and reprogramming due to the time consuming iterative erasure. Because of such a slow reprogram time, the stacked gate Flash EEPROM devices can only be used in applications where the reprogramming of the device is infrequent. The stacked gate EEPROM devices are not suitable for high speed applications like hard disk drive replacements, where 10 to 20 milliseconds of much faster erase time is required.

In order to solve the over-erase problem, two different types of EEPROMs have been introduced. One type of EEPROM employs a two-transistor cell structure which was disclosed by Periegos in U.S. Pat. No. 4,558,344 issued Dec. 10, 1985. Another type of EEPROM cell employs a single transistor called the split gate, and one such cell was disclosed by Samachisa et al. in U.S. Pat. No. 4,783,766 issued Nov. 8, 1988.

The two-transistor EEPROM cell of Periegos shown in FIG. 5 solved the over-erase problem and several other problems inherent to the stacked gate cell. The Perlegos prior art employs a select gate 54 and a tunneling window 57 of thin oxide. Electrons are tunneled through tunneling window 57 between a floating gate 55 and a substrate 50 by the Fowler-Nordheim tunneling for both programming and erasing of floating gate 55. Select gate 54 in the Periegos cell blocks the leakage current from over-erased floating gate 55 when the cell is not selected, and eliminates the over-erase related drawbacks. However, the major disadvantage of Perlegos prior art was the big cell size. Perlegos cell occupied about four times larger area than stacked gate cells, increasing the chip size and the cost accordingly. Another Perlegos cell shown in U.S. Pat. No. 4,701,776 (issued Oct. 20, 1987) reduced the cell area by a half of his prior art cell, but the size of cell area still remained more than twice the size of stacked gate cells. The two-transistor EEPROM devices are usually manufactured in relatively low densities due to their large cell size and relatively high cost.

The split gate EEPROM cell of Samachisa et al. shown in FIG. 2 also solved the over-erase and other problems related to the stacked gate cells, while reducing the cell size to about a half of the two-transistor EEPROM cell size. This was achieved by a combination of a storage transistor (55 and 56 in FIG. 5) and a select transistor (54 in FIG. 5) in the two-transistor EEPROM cell into one single transistor having two split channels under a control gate 24 as shown in FIG. 2. The "select gate portion" of a channel 25 between a source 21 and a point 20a below control gate 24 has the function of blocking the leakage current coming from the "floating gate portion" of channel 25 between a point 20b and a drain 22 under an over-erased floating gate 23, when control gate 24 is turned off. As there are no concerns about the over-erase problem, the split gate EEPROM devices can be erased at a full potential speed which takes only 10 to 20 milliseconds to erase a full chip in densities of millions of bits. The erasure of the split gate cell is accomplished by the Fowler-Nordheim tunneling from floating gate 23 to control gate 24, to drain 22, or to the erase gate (not shown) depending on the implementations. The programming of the split gate cell is accomplished by the conventional channel hot electron injection at a drain junction 20c as in the stacked gate cells.

A number of different variations of split gate cells have been introduced so far. Examples of such split gate EEPROM cells are shown by Miccoli et al. in U.S. Pat. No. 4,412,311 issued Oct. 25, 1983, by Samachisa et al. in U.S. Pat. No. 4,783,766 issued Nov. 8, 1988, by Eitan in U.S. Pat.

No. 4,795,719 issued Jan 3, 1989, by Lu et al. in U.S. Pat. No. 5,036,378 issued July 30, 1991, and by Harari in U.S. Pat. No. 5,095,344 issued May 10, 1992. Each of these prior arts attempted to solve new problems found in the split gate cells, or added new improvements.

In theory, the split gate EEPROM devices looked easy to manufacture with only 30 percent larger size than a stacked gate cell, but actual production of split gate device was not easy because the split gate cell was very sensitive to the mask misalignments which usually occurred in the manufacturing environment. Referring back to FIG. 2, if the masks are misaligned during the manufacturing, the "select gate portion" of control gate 24 may be made substantially smaller than the "floating gate portion" of control gate 24, or vice versa, when control gate 24 itself has a minimum allowed dimension. As a result, there were severe batch-to-batch variations in the performance of split gate EEPROMs. In order to overcome such manufacturing difficulties, the Samachisa prior art and the Eitan prior art incorporated the self-align process technique widely used in EPROM manufacturing. The name of "flash EEPROM" originated from the description by Masuoka et al. in 1984 IEDM Technical Digest, p. 464 in an article titled "A new flash EEPROM cell using triple polysilicon technology". The Masuoka prior art incorporated a separate erase gate within each of the split gate cells and connected all the erase gates with same wire, thus all cells could be erased at once in a flashy speed. However, the Masuoka cell had disadvantages of a large cell size and sensitivity to mask misalignment. Disadvantages of the Masuoka prior art have been overcome by Lu et al. in U.S. Pat. No. 5,036,378 issued July 30, 1991, and by Harari in U.S. Pat. No. 5,095,344 issued May 10, 1992. The Lu and Harari prior arts incorporated the buried diffusion, self-align techniques, and new erase gate structures in order to have a reduced cell size and improved manufacturability.

Still, the major drawbacks of split gates are the low programming efficiency and the use of relatively high drain voltages during the programming. Most prior art split gate cells are programmed by the conventional channel hot electron injection method which has a very low programming efficiency. It is well known in the art that generally less than 0.000005 percent of the source-to-drain current is actually injected into the floating gate during the programming. Such low injection efficiency unnecessarily wastes power and prohibits faster programming. Presently, split gate EEPROMs are required to apply 8 to 9 volts to the drain and 12 volts to the control gate during the programming, while the chip power supply voltage is only 5 volts. Since the control gates do not conduct DC currents during the programming, the size of the 12-volt charge pump can be made relatively small. However, a relatively large size charge pump is required to generate the high drain voltage from the 5-volt power supply because a large amount of DC current will flow between the source and the drain of each cells during the programming. The use of a high voltage at the drain also requires a high voltage endurance junction for the drain in order to prevent the punch-through and the junction breakdown problems. The high voltage junction not only results in a larger cell area and a larger chip size, but also makes the fabrication process difficult to scale down.

An attempt to improve the efficiency of hot electron injection to the floating gate has been made by Wu et al. as disclosed in U.S. Pat. No. 4,794,565 issued Dec. 27, 1988. The preferred embodiment of the Wu prior art shown in FIG. 3 includes a second vertical floating gate called a side wall gate 35 at the source side of conventional stacked gate structure in order to induce the hot electron injection from a source 31 when a control gate 34 is applied with a high voltage. This type of hot electron injection is called the source side injection (SSI) phenomenon in the art. The source side injection phenomenon was discovered from the earlier researches on the undesirable gate currents in the MOS transistor, in which the source region implant was slightly misaligned to create a gap between the source and the gate. Wu et al. compared the performances of source side injection and conventional channel hot electron injection in their patent and in an article of 1986 IEDM p. 584, entitled "A Novel High-Speed 5-Volt Programming EPROM Structure". Also, Naruke et al. recreated the Wu prior art with a slight modification and reported in 1989 IEDM p. 603 in an article titled "A New Flash-Erase EEPROM Cell with a Sidewall Select-Gate on its Source Side". Although both articles reported drastic improvements of hot electron injections in the source side injection by 1,000 to 10,000 times compared to the conventional channel hot electron injection, they could not explain exactly how such improvement had occurred. Mar et al. introduced another modified source side injection cell in U.S. Pat. No. 5,280,446 issued Jan. 18, 1994. Besides the high programming efficiency, Wu, Naruke, and Mar prior arts have an additional advantage of using relatively low drain voltages for the programming operation.

Even though Wu, Naruke, and Mar prior arts have the same basic cell structure for the source side injection mechanism, they can be differentiated by the method of connecting the side wall gate. In the case of the Wu prior art in FIG. 3, side wall gate 35 is made to float. Floating side wall gate 35 couples the "weak gate control" voltage from control gate 34. The coupled voltage of floating side wall gate 35 can shift widely depending on the process variations. Also, floating side wall gate 35 can be negatively charged by the accumulation of stray electrons after thousands of programming cycles. Since there is no path to discharge the accumulated negative charges from floating side wall gate 35, the negative voltage of floating side wall gate 35 can permanently turn off the channel below, and the cell will eventually become nonfunctional. In the case of the Naruke prior art, side wall gate 35 in FIG. 3 is not floating. Instead, it is extended in side ways (perpendicular to the cross-sectional view in FIG. 3 ) to work as a word line connector between the cells. Now, a stable voltage can be enforced to side wall gate 35 by the word line connection. Since the polysilicon side wall gate is narrowly formed by a destructive formation called the RIE (Reactive Ion Etching) process, such a long word line of narrow side wall will have a very high electrical resistance. Also, it is not convenient to make connections from the metal lines to such narrow polysilicon side wall lines. The Mar prior art improved the drawback of the Naruke prior art by running the word line connection of the side wall gate in a perpendicular direction to that of the Naruke prior art. The word line connection of a select gate 45 in FIG. 4 of the Mar prior art runs in a direction from a source 41 to a drain 42. Due to this polysilicon word line passing over source 41 and drain 42, the metal line connections can not be made directly to source 41 or drain 42. Hence, multiple cells have to share a long source connection and a long drain connection. Consequently, the read speed of the Mar prior art will be significantly slower than other prior arts due to the high resistance of the long diffusion lines.

Besides the individual drawbacks mentioned above, the Wu, Naruke, and Mar prior arts have five common disadvantages: the false read problem, the program disturb problem, the insufficient margin of the select gate voltage, the process sensitivity, and the need of a low voltage generator.

First, these source side injection prior arts have the false read problem related to the same over-erase problem commonly found in the stacked gate cells, due to the lack of a proper select gate. It is well known in the art that short channel gates tend to have severe sub-threshold leakage currents, especially when the gates are in sub-micron dimensions. Side wall gate 35 in FIG. 3 used as a select gate is as thin as the thickness of gate polysilicon, and is much narrower than the length of a floating gate 33 which already has a minimum sub-micron dimension at the present time. Therefore, a significant amount of sub-threshold leakage current will flow between source 31 and a point 30b on a channel 36 even when side wall gate 35 is turned off, if floating gate 33 is over-erased and conducting. As multiple cells share a common bit line and the leakage currents from each cell will add up, the substantial sum of combined leakage currents will cause a malfunction of the sense amplifier, resulting in a false data read from the selected cell and causing a significant device reliability problem. The same situation can happen in the Mar prior art because the distance between an edge 40a and a point 40b in FIG. 4 is also relatively shorter than the standard minimum gate length of floating gate 43. In order to get around the false read problem caused by the over-erased floating gate and the leaky select gates, the source side injection EEPROM device must use the time consuming iterative erase algorithm commonly used in the stacked gate EEPROM devices. As a result, the erase time will take several seconds for the source side injection EEPROM devices.

Second, the sub-threshold leakage current of the side wall (or select) gate mentioned above results in another reliability problem called the program disturb in the source side injection EEPROM devices. During the program operation, side wall gate 35 in FIG. 3 and select gate 45 in FIG. 4 of the source side injection cells are usually biased just slightly above the threshold voltage or are almost turned off in order to maximize the programming efficiency. For the programming of the Naruke prior art cell, side wall gate 35 is applied with only 1.5 volts whereas its threshold voltage is about 1 volt. As compared to the 5 volts of side wall gate voltage during the read operation, side wall gate 35 is operating in an almost turned-off state during the programming. What that means is that the source side injection needs only a small amount of the source-drain current for the programming. Now, if there are leakage currents through the side wall (or select) gate in the unselected (turned off) cells which share the same control line as the selected (to be programmed) cell, then these unselected cells will also have small but significant amount of electrons injected into the floating gate due to the high control gate voltage applied while the selected cells are being programmed. If the programming is repeated for other blocks of cells which share the same control line, unselected cells with the leaky side wall (or select) gate will be eventually programmed to contain wrong data. Therefore, this program disturb phenomenon is a serious reliability problem for the source side injection EEPROMs.

Third, the side wall (or select) gate voltages used for the programming of the source side injection cells do not have sufficient noise margins. The Naruke prior art uses 1.5 volts and the Mar prior art uses 2 volts for the side wall (or select) gate during the programming. The floating side wall gate of the Wu prior art is assumed to have a similar level of voltage which is capacitively coupled from the control gate during the programming. As compared to the 1-volt threshold voltage and the 5-volt power supply voltage, the 1.5 volts and 2 volts do not give enough noise margin for the side wall (select) gate. The voltage fluctuations and the noise glitches on the power supply line and the ground line will undesirably turn on the unselected gates or turn off the selected gates due to the relatively small voltage margins. Since the side wall (select) gate is operating in the linear region of the transistor transfer curve at such a low bias, a small amount of noise will be amplified to cause substantial fluctuations in the source-to-drain current and will result in undesirable electron injections to the floating gates of the unselected cells. Therefore, it is not safe to use the source side injection EEPROM devices having such low voltage margins in the ordinary environments, where the noises are quite common.

Fourth, since the electron injection area is located very close to the source, the functionality of the source side injection is very sensitive to the variations in the manufacturing process. Due to the fact that the select gate is operating in the very sensitive linear region, slight changes in the process parameters will cause substantial variations in the performance of the source side injection devices. If the channel length of the narrow select gate (the distance between edge 40a and point 40b FIG. 4) is slightly increased due to a process variation, then the programming efficiency and speed will drop substantially due to a drastic reduction of carriers, as the select gate voltage is kept at the same low level. If the doping level of the channel is slightly increased, then the increased select gate threshold voltage will substantially reduce the programming efficiency. Also, since the side wall gate and select gate are narrow devices, a slight reduction in the channel length between an edge 30a and a point 30b in FIG. 3 (also, between edge 40a and point 40b in FIG. 4) will drastically increase the sub-threshold leakage current, which will seriously affect the program disturb and the false read problems mentioned above. Hence, manufacturing of such devices with consistent results and scaling of the process would be very difficult.

Fifth, the Naruke and Mar prior arts require low voltage generators in order to provide 1.5 volts and 2 volts for the side wall (select) gates from the 5-volt power supply voltage. If the low voltage generator circuit is not carefully designed, the process variations and the operating temperature variations will significantly impact the accuracy of the low voltage and in turn will significantly affect the programming efficiency and speed.

In a conclusion, the source side injection prior arts mentioned above are not easy to manufacture, are not easy to scale, and are not reliable to use due to the false read problem, the program disturb problem, the noise sensitivity, and the process sensitivity which are caused by the proximity of the electron injection area to the source, even though the programming efficiency is very high.

Yeh proposed in U.S. Pat. No. 5,029,130 issued Jul. 2, 1991 that a split gate similar to the one in FIG. 2 could generate a carrier injection similar to the source side injection if he would use a different programming bias compared to the split gate embodiment proposed by the Wu prior art patent. But it is still believed that the conventional hot electron injection at the drain is more dominant than the source side injection in his cell because a very high drain voltage is used. It is well known that the source side injection does not use a high voltage at the drain during the program. As in the Miccoli prior art, the Yeh split gate cell uses a drain-to-gate coupling to obtain a high floating gate voltage for the channel hot electron injection Such a coupling is known in the art to cause undesirable punch-through failures and leakage currents due to a very high voltage at the drain. The Yeh split gate cell also employs a pointed floating gate for enhanced poly-to-poly erasure between the floating gate and the control gate. The pointed floating gate is not easy to scale and is not easy to reproduce consistently in the mass production environment, because the size of polysilicon granule is not consistent. Disadvantages of Yeh prior art include the use of very high voltage at the drain, a large overlap area between the floating gate and the drain, susceptibility to punch-through failure, sensitivity to drain voltage, and difficulties in manufacturing and process scaling.

OBJECT OF THE INVENTION

It is therefore an object of the invention to provide flash EEPROM cell and array structures that result in a flash EEPROM device without the over-erase problem.

It is another object of the present invention to provide flash EEPROM cell structures employing a highly efficient carrier injection method that results in substantially increased programming efficiency and substantially faster programming speed.

It is a further object of the present invention to substantially eliminate the program disturb problem and the false read problem which are inherent in prior arts employing the source side injection method.

It is yet another object of the present invention to provide a flash EEPROM device which can be programmed and erased without applying high voltages at the drain or the source.

It is yet another object of the present invention to provide a flash EEPROM device which can be operated using only one single voltage power supply instead of dual voltage power supply.

It is yet another object of the present invention to provide array structures which can optimize the flash EEPROM device either for high speed applications such as EPROM replacement or high density applications such as hard disk drive replacement.

It is still another object of the present invention that flash EEPROM cell and array structures be highly manufacturable, and easily scalable to advanced manufacturing processes.

SUMMARY OF THE INVENTION

A flash EEPROM device employing a mid channel injection method in accordance with the present invention is disclosed. The flash mid channel injection EEPROM device includes a two-dimensional array of memory cells, array connections, voltage generators, and other necessary means. The memory cell includes a floating gate, a control gate, and a select gate above a channel between a source and a drain to form a single transistor on the silicon substrate. The memory cell also includes a carrier acceleration passage in the middle of the channel between the select gate and the floating gate. Seven embodiments of memory cells employing the mid channel injection method are described. A combination of a conventional EPROM process and a triple-poly DRAM process may be used for the manufacturing of the devices of the present invention.

The memory cell is programmed by the mid channel injection method which accelerates charge carriers such as electrons first to gain sufficient momentum and then to deflect toward the floating gate. The carrier injection efficiency of the mid channel injection method is at least two orders of magnitude higher than the conventional channel hot electron injection method which uses the unfavorable pinch-off region near the drain for the acceleration and deflection of carriers. The fact that a high voltage is not used at the drain during the program and erase operations simplifies the voltage generation circuit with a single supply voltage, eliminates the need of a high voltage junction in the memory cell, and thus improves manufacturability and scalability. The erase operation is accomplished by the Fowler-Nordheim tunneling between the floating gate and the drain. The use of a fully-characterized gate for the select gate eliminates the over-erase problem as well as the false read and the program disturb problems found in the prior arts.

Two types of array connection methods may be used to connect the mid channel injection cells in accordance with the present invention. A flash mid channel injection EEPROM device employing the NOR-type array connection method can be used for high speed applications such as BIOS storage in personal computers. Another device employing the virtual ground array can be used for lower speed and high density applications such as hard disk replacements.

DESCRIPTION OF THE PREFERRED EMBODIMENTS

The presently preferred embodiments of the invention are disclosed. The following detailed description is meant to be illustrative only and not limiting the scope of the present invention. Although presently preferred embodiments of the invention are n-channel devices, it will be obvious to one skilled in the art that a p-channel embodiment, a CMOS embodiment, and other semiconductor embodiments may be practiced. Well-known processing steps are not described in detail in order not to obscure the present invention.

Memory Cell Structures

Figure 6:
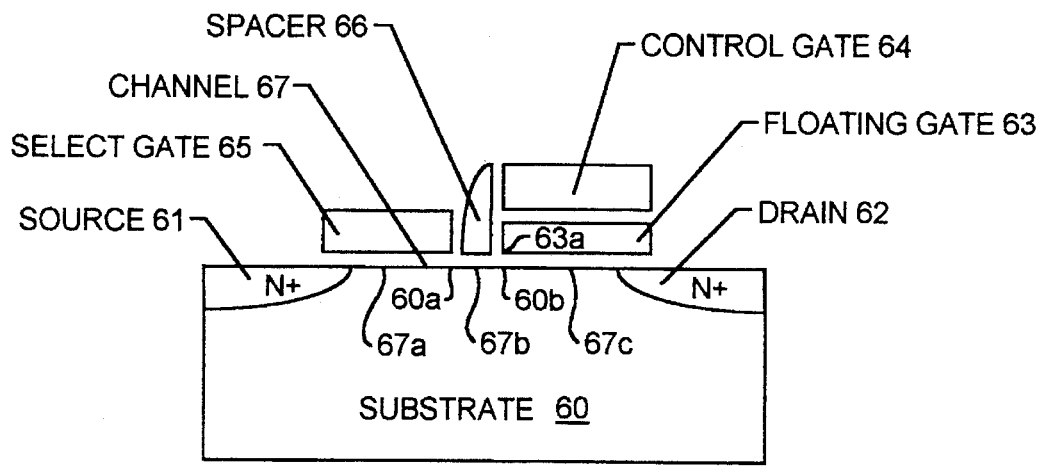
FIG. 6 is a cross-sectional view of a mid channel injection cell illustrating the first and the second embodiments of the present invention.

Referring now to FIG. 6, a cross-section of a mid channel injection cell is shown to illustrate two embodiments of the present invention. A source 61 and a drain 62 of n-type conductivity are formed on a silicon substrate 60 of p-type conductivity. A channel 67 is defined as the surface region of substrate 60 between source 61 and drain 62. Channel 67 is also called a n-channel due to the fact that charge carriers are electrons. A floating gate 63 is disposed over channel 67 near drain 62. Floating gate 63 is electrically isolated from the surface of substrate 60 by an oxide (Silicon Dioxide) film as an insulating material. As well known in the art, the oxide is generally used as an insulating material for the isolation of structures in the cell although it is not depicted in the illustration. A control gate 64 overlies floating gate 63 with an insulating material sandwiched between these two gates 63 and 64. This sandwiched insulating material may be the ONO (Oxide-Nitride-Oxide) instead of the oxide. Control gate 64 and floating gate 63 are simultaneously formed by the self-align process, which is also a well known art in the existing EPROM manufacturing. This self-align process allows the precise control of the overlap between floating gate 63 and drain 62. A select gate 65, which has about equal channel length as floating gate 63, is positioned over but insulated from channel 67 and source 61. Select gate 65 is self-aligned with source 61 and has a minimum lateral overlap with source 61 to avoid the unnecessary source-side injection of electrons onto select gate 65. The materials used for gates 63, 64 and 65 include the conductive polysilicon and the silicide.

A carrier acceleration passage 67b is defined as a middle portion of channel 67 between a point 60a below the fight edge of select gate 65 and a point 60b below the left edge of floating gate 63. The length of carrier acceleration passage 67b is determined by the thickness of insulating material between select gate 65 and the stack of control gate 64 and floating gate 63. In order to achieve a desired length of carrier acceleration passage 67b a first preferred embodiment grows a uniformly thick oxide film over channel 67 and the stack of control gate 64 and floating gate 63, before the formation of select gate 65. Thus, the oxide below select gate 65 will have about equal thickness as the oxide formed along the carrier acceleration passage. This embodiment is a simpler process than other embodiments but lacks the freedom of adjusting the length of carrier acceleration passage 67b independently from the thickness of the oxide below select gate 65. A second preferred embodiment includes a spacer 66 of insulating material between select gate 65 and the stack of control gate 64 and floating gate 63. Spacer 66 allows the length of carrier acceleration passage 67b to be independently adjusted regardless of the thickness of the oxide below select gate 65.

Figure 5:
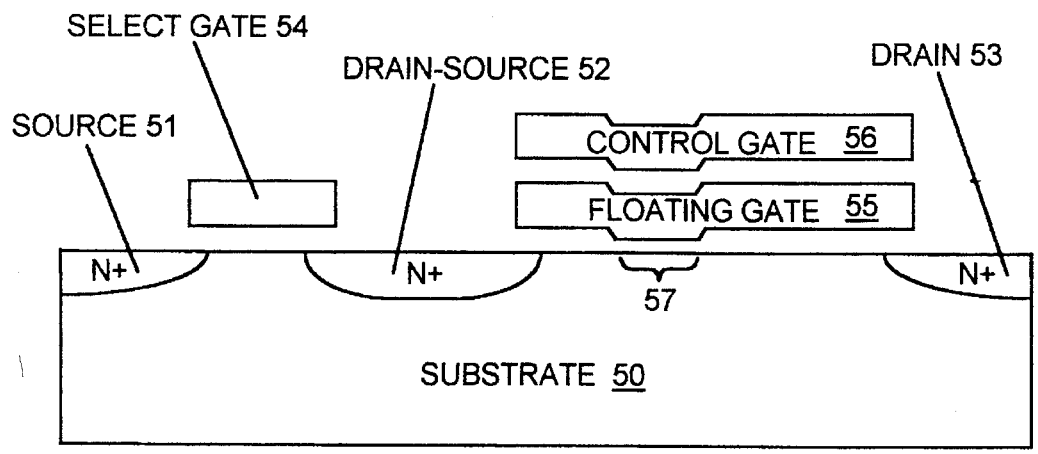
FIG. 5 is an illustration of a two-transistor EEPROM prior art cell.

The two embodiments of the present invention described above may seem to have structural similarities with the two-transistor EEPROM prior art cell depicted in FIG. 5, but they have two major differences. One difference is the combination of two transistors into one transistor by the elimination of a drain-source 52 in FIG. 5. The elimination of drain-source 52 enables a drastic reduction of cell size and also enables a new programming mechanism called the "mid channel injection (MCI)" which results in about 1000 times faster programming speed than the Fowler-Nordheim tunneling employed for the programming of the two-transistor EEPROM prior art. Another difference is the elimination of tunneling window 57 of thinner oxide which is used for both the programming and the erasing of the two-transistor EEPROM prior art. By the elimination of this tunneling window, the manufacturing process becomes much simpler and the cell structure is improved by another drastic size reduction.

Figure 1:
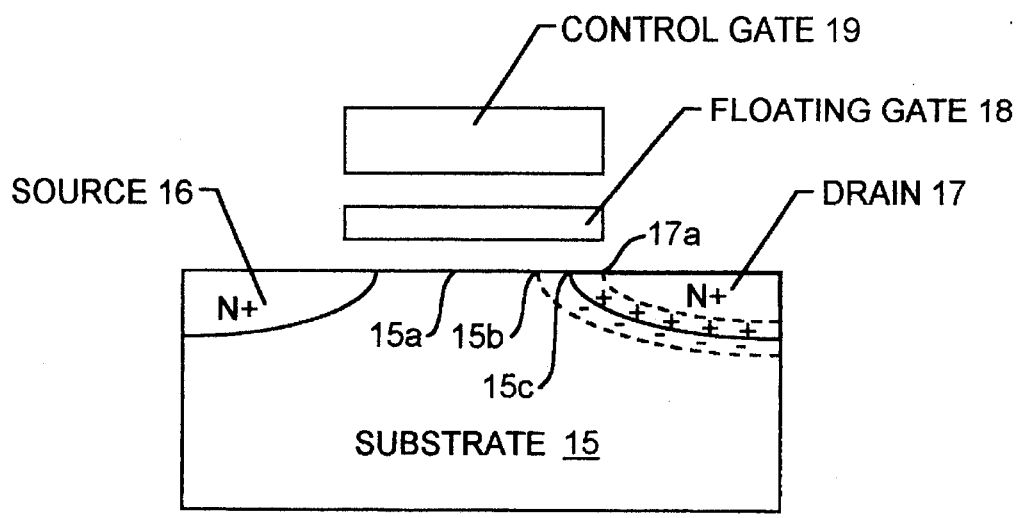
FIG. 1 is an illustration of a stacked gate prior art cell.

The two embodiments mentioned above have three major advantages over other prior arts. First, the present invention does not have the over-erase problem found in the stacked gate prior art shown in FIG. 1. This is due to the fact that select gate 65 in FIG. 6 blocks the leakage current flowing from over-erased floating gate 63 when the cell is not selected. The stacked gate prior art avoids the over-erase problem by a lengthy iteration of erase-and-test in small steps. The chip erase time can be drastically reduced from several seconds to tens of milliseconds if the time consuming step-by-step erase iterations are eliminated. Since the over-erase problem does not exist in the present invention, the erase time of the devices in accordance with the present invention is at least 100 times faster than the stacked gate prior art devices.

Figure 3:
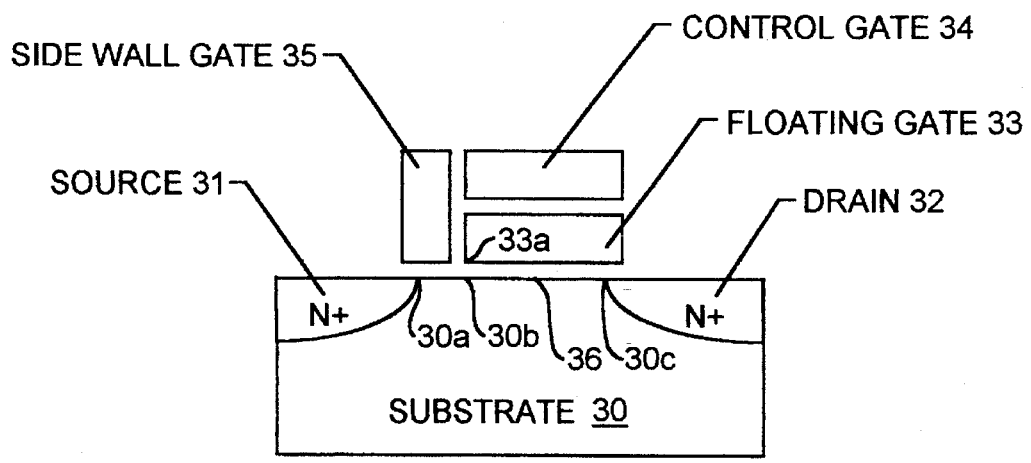
FIG. 3 is an illustration of the Wu prior art cell employing source side injection.
Figure 4:
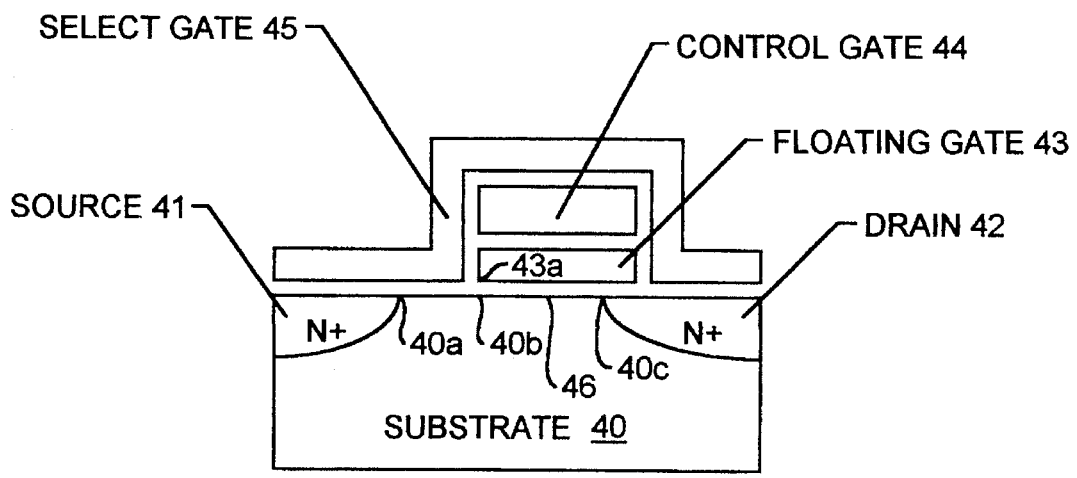
FIG. 4 is an illustration of the Mar prior art cell employing source side injection.

Second, as explained later, the present invention has at least two orders of magnitude faster programming speed compared to the stacked gate prior art and the split gate prior art. This improvement in programming speed is due to the higher programming efficiency of the mid channel injection method employed in the present invention. The mid channel injection method has a similar programming performance as the source side injection methods employed in the Wu prior art (FIG. 3 ) and the Mar prior an (FIG. 4 ).

Third, the present invention does not have the program disturb and the false read problems inherent in the Wu prior an and the Mar prior art. This is because the present invention uses a fully-characterized minimum length gate for select gate 65 in FIG. 6 in order to substantially reduce the sub-threshold leakage current, which is the prime cause for the program disturb and the false read problems. Additional advantages of the present invention will be explained later.

Figure 7:
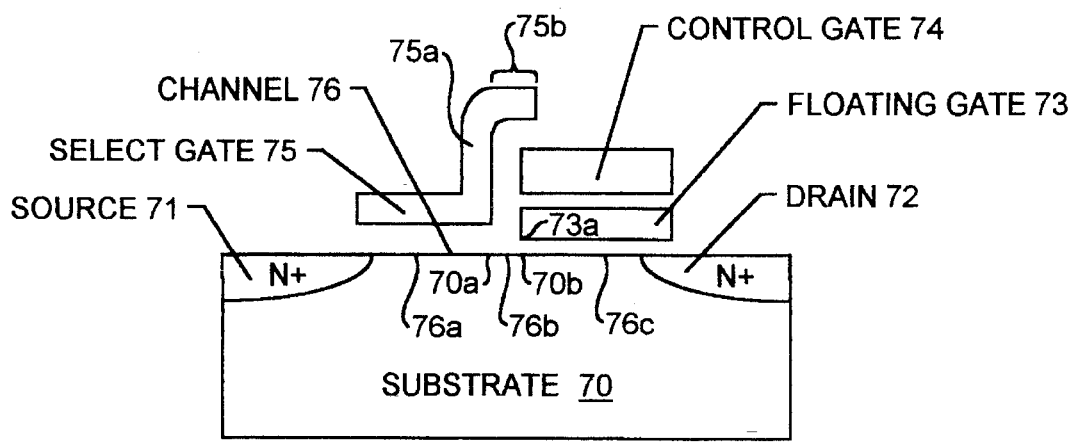
FIG. 7 is an illustration of a mid channel injection cell having an extension of the select gate for overlapping in accordance with the third embodiment of the present invention.

FIG. 7 shows a cross-sectional view of a mid channel injection cell in accordance with a third preferred embodiment of the present invention. An extension 75a and an overlap 75b are additional elements to select gate 75 but other elements are same as the elements in the first preferred embodiment described above. The dimension of overlap 75b is predetermined by the minimum mask alignment margin of the given fabrication process in order to minimize the coupling capacitance between select gate 75 and control gate 74. Overlap 75b ensures that extension 75a and select gate 75 always touch the side surface of the insulation material (not shown) coveting the stack of control gate 74 and floating gate 73 without any void. Hence, the predetermined length of carrier acceleration passage 76b is always maintained, even when a misalignment occurs between select gate 75 and the stack of control gate 74 and floating gate 73. Overlap 75b also prevents extension 75a from peeling off the stack of control gate 74 and floating gate 73.

Figure 8:
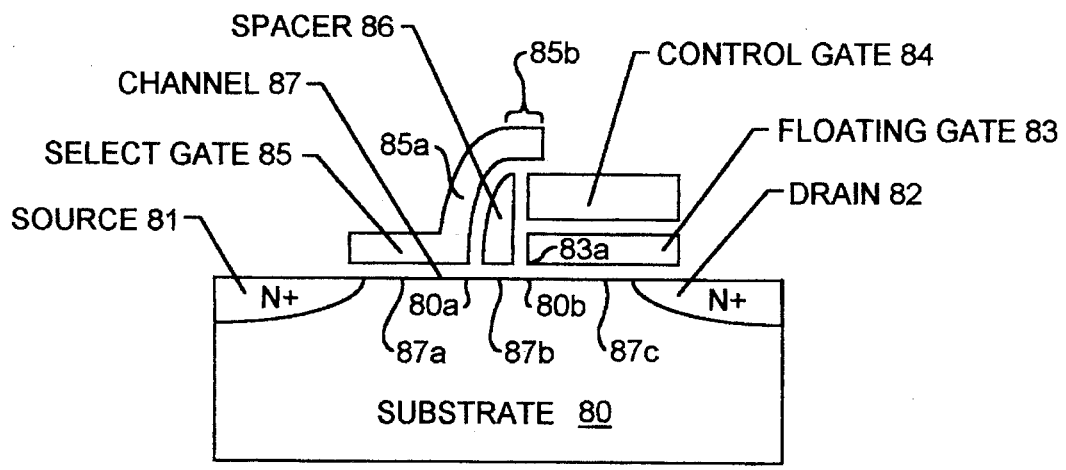
FIG. 8 is an illustration of a mid channel injection cell having a spacer and an extension of the select gate for overlapping in accordance with the fourth embodiment of the present invention.

FIG. 8 presents a cross-sectional view of a mid channel injection cell in accordance with a fourth preferred embodiment of the present invention. A spacer 86, an extension 85a, and an overlap 85b are additional elements but other elements are same as the elements in the first preferred embodiment described above. Overlap 85b is kept minimum in order to minimize the coupling capacitance between select gate 85 and control gate 84. As previously explained, the advantage of having spacer 86 is the flexible capability of independent length adjustment for carrier acceleration passage 87b when the insulator thickness between select gate 85 and substrate 80 is fixed. Also, the advantages of having extension 85a and overlap 85b are the consistent creation of the uniform length for carrier acceleration path 87b regardless of the mask misalignment and the prevention for the peel-off of extension 85a.

Figure 9:
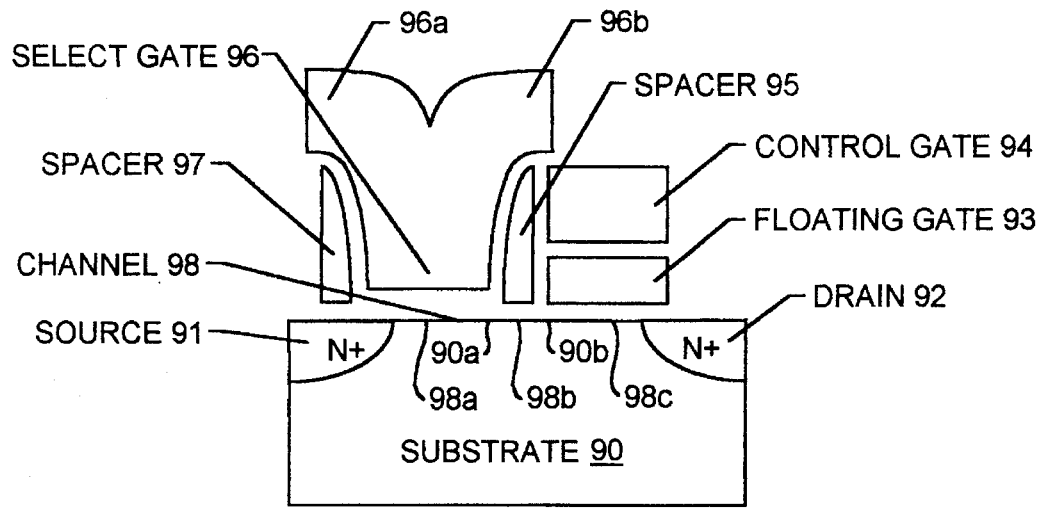
FIG. 9 is an illustration of a mid channel injection cell with two spacers and two extensions of the select gate for overlapping in accordance with the fifth embodiment of the present invention.

FIG. 9 illustrates a mid channel injection cell in accordance with a fifth preferred embodiment of the present invention. The two spacers 95 and 97, the two overlaps 96a and 96b, and the increased thickness of select gate 96 are additional elements to the first preferred embodiment of the present invention. When the thickness of conductive material of select gate 96 is larger than a half length of select gate 96, select gate 96 becomes a T-shaped structure in a cross-sectional view. Overlaps 96a and 96b provide the misalignment margin for select gate 96. This embodiment is useful for the advanced fabrication process having very narrow dimensions.

Figure 10:
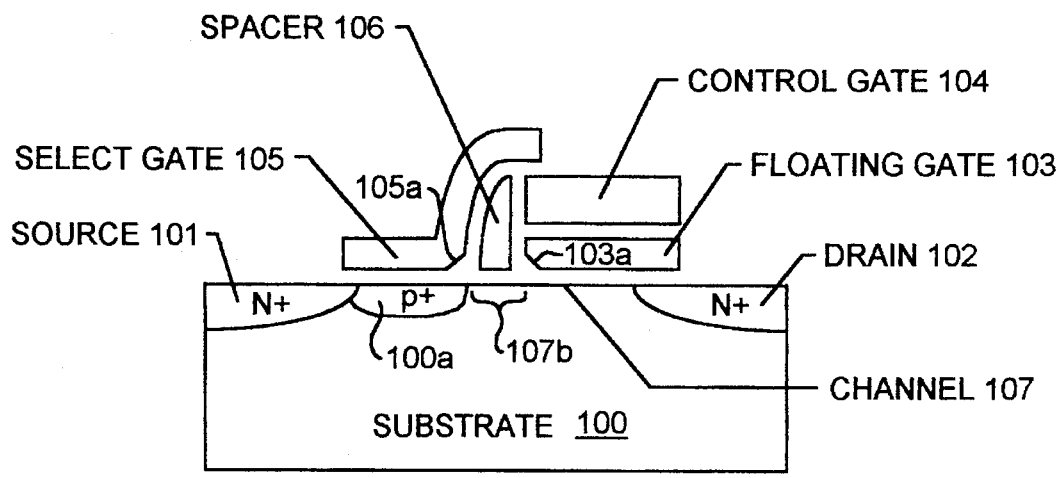
FIG. 10 is an illustration of a mid channel injection cell in accordance with the sixth and the seventh embodiments of the present invention showing an additional p+ implant and an angled edge of the floating gate.

FIG. 10 illustrates three additional embodiments of the present invention in one drawing. A sixth embodiment of the present invention further includes an additional p+ doped region 100a under select gate 105 in order to have two different threshold voltages for select gate 105 and floating gate 103. Having a lower threshold voltage for floating gate 103 helps a higher current to flow for a same erased level of floating gate 103. A seventh embodiment of the present invention further includes a differently shaped floating gate 103 which has an angled edge 103a facing carder acceleration passage 107b. This angled edge 103a is intended for a better injection of carders to floating gate 103. An eighth embodiment of the present invention further includes a differently shaped select gate 105 which has an angled edge 105a facing carder acceleration passage 107b. This angled edge 105a is intended for a better acceleration of carders. The features in these three embodiments can be combined with any other embodiment of the present invention described above.

Method Of Manufacturing

A flash mid channel injection EEPROM device in accordance with the present invention can be manufactured by a combination of a conventional EPROM process and a conventional triple-poly DRAM process. Only the key process steps of the fabrication method for a presently preferred embodiment of the present invention are illustrated in FIG. 10A–10E in order not to obscure the concept with unnecessary details. Other embodiments can be manufactured by a similar process.

Figure 10A:
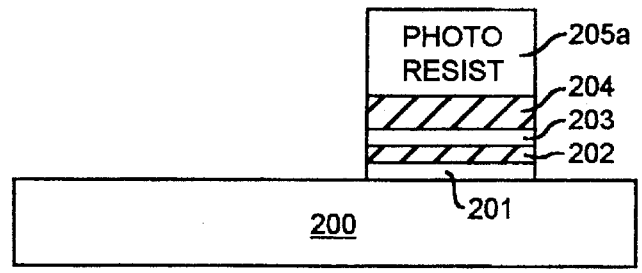
FIG. 10A–10E are manufacturing steps of a preferred embodiment of present invention.

FIG. 10A shows a cross section after the etching of control gate 204, inter-poly insulation 203, floating gate 202, and floating gate oxide 201 by using photo resist 205a as a mask. Substrate 200 is a p-type silicon, if the embodiment employs the n-channel MOS transistors. The conductive material used for floating gate 202 and control gate 204 is heavily N+ doped polysilicon. The thickness of floating gate 202 can be thinner than that of control gate 204 since it does not carry current. Control gate 204 can be a silicide. Inter-poly insulation 203 can be ONO (Oxide-Nitride-Oxide) or silicon dioxide.

Figure 10B:
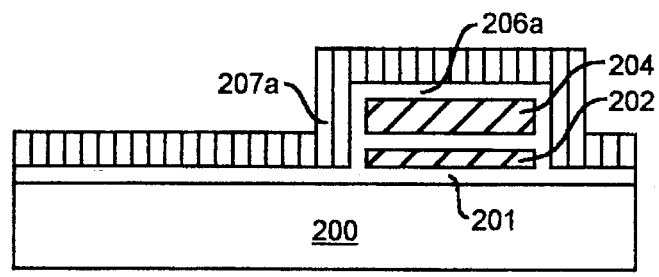

In FIG. 10B protective layer 206a is romped by thermally grown silicon dioxide, and a conformal film of LPCVD silicon dioxide is deposited as spacer layer 207a. Protective layer 206a can be a silicon nitride film. Spacer layer 207a can be thermally grown silicon dioxide in case of the first embodiment (FIG.6 without spacer 66) and the third embodiment (FIG. 7).

Figure 10C:
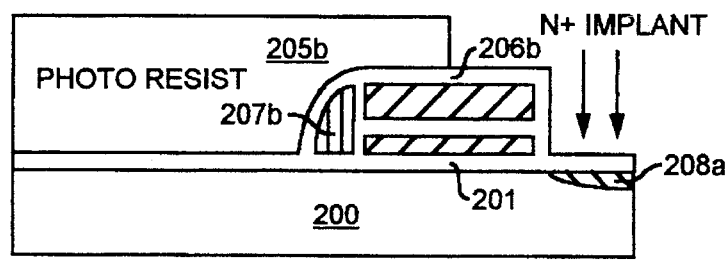

FIG. 10C shows a cross section after spacer 207b is formed and the ion implantation of n-type impurity atoms (Arsenic or Phosphorus) is done to create the N+region of drain 208a. Spacer 207b is formed by the anisotropic reactive ion etching which is well known in the art. Photo resist 205b is used to remove another unnecessary spacer (not shown) at the drain side before the N+ implantation.

Figure 10D:
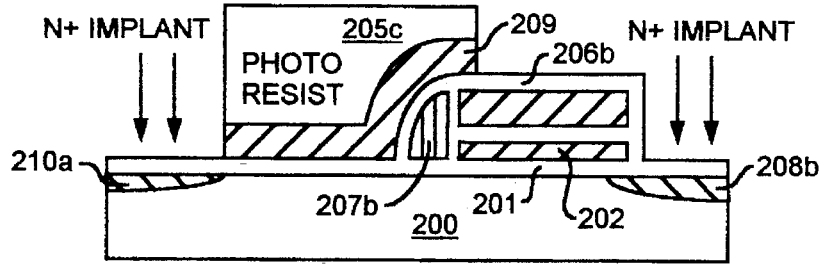

FIG. 10D is a cross section after the formation of select gate 209 and the N+ implantations at source 210a and drain 208b. Select gate 209 is etched back using photo resist 205c after a layer of heavily N+ doped polysilicon is deposited over oxide 206b. Select gate 209 can be a silicide. Drain 208b is self-aligned with the fight edge of floating gate 202 while source 210a is also self-aligned with the left edge of select gate 209.

Figure 10E:
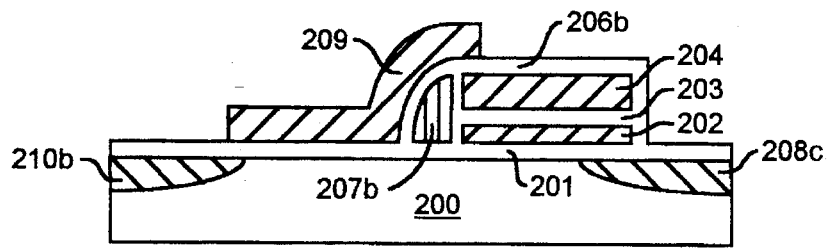

FIG. 10E is a cross section after the diffusion process step at high temperatures. The implanted impurity atoms such as Arsenic or Phosphorus are diffused to form source 210b and drain 208c regions. The remaining part of the process steps such as metalization and passivation are conventional.

Theory Of Operation

The method of programming in a flash EEPROM device employing the mid channel injection according to the present invention is quite different from that of existing flash EEPROM devices.

Figure 11:
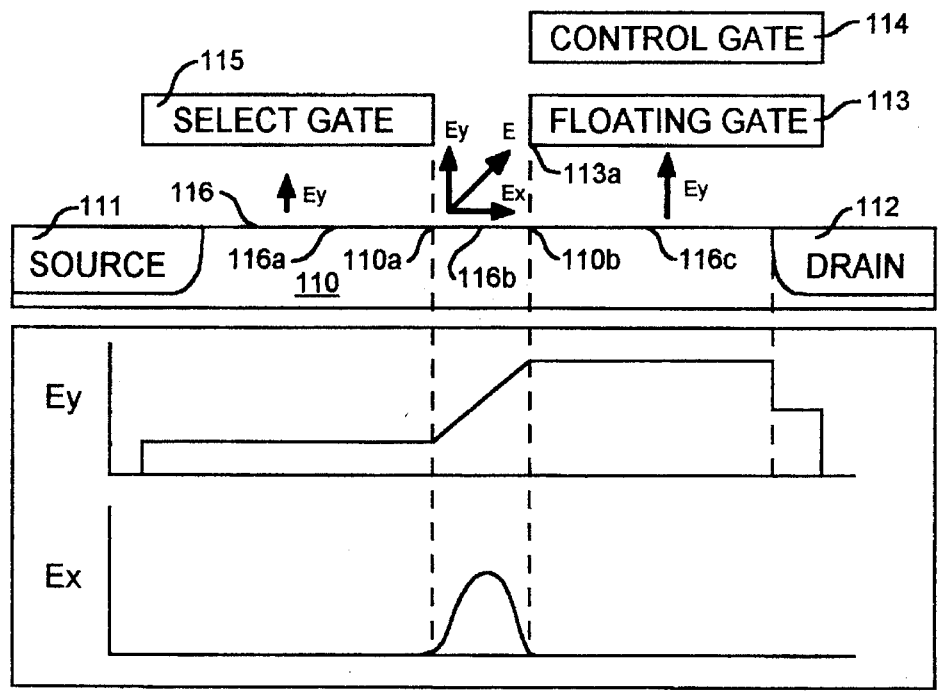
FIG. 11 is an electric field diagram of present invention.

FIG. 11 illustrates a mid channel injection cell and an electric field diagram of the present invention in the programming mode. As an example of programming bias condition in a n-channel embodiment where carriers are electrons, control gate 114 is applied with a high potential of 12 volts, source 111 is grounded, and both drain 112 and select gate 115 are applied with 3.3 volts which is equivalent to a standard power supply voltage. The potential of floating gate 113 will be about 6 volts if the coupling ratio is 50 percent from control gate 114 to floating gate 113. In such a condition, electrons on channel 116 experience different electric forces as they move along channel 116 from source 111 to drain 112. Electrons experience only vertical forces (Ey) at channel region 116a under select gate 115 and at channel region 116c under floating gate 113. However, electrons on carrier acceleration passage 116b are pulled by both horizontal (Ex) and vertical (Ey) electric forces due to the horizontal and vertical components of electric field created by edge 113a of floating gate 113.

Initially, electrons under select gate 115 do not have high horizontal momentum. As electrons enter carrier acceleration passage 116b, they are accelerated by the horizontal component of the electric field and gain a very high horizontal kinetic energy. Once high horizontal momentum is built up, the electrons then turn upward by the vertical electric forces and fly toward floating gate 113. This phenomenon is similar to the movement of electrons in the CRT (Cathode Ray Tube) or the cyclotron when they are deflected by the electric or magnetic field.

Not all electrons entering carrier acceleration passage 116b reach floating gate 113. Most of the accelerated (hot) electrons collide with or scattered by the silicon dioxide molecules in the insulation region and lose most of the kinetic energy acquired. Only very few (about 0.005 percent) of accelerated electrons can survive such collisions and scattering, and successfully reach floating gate 113.

Figure 12:
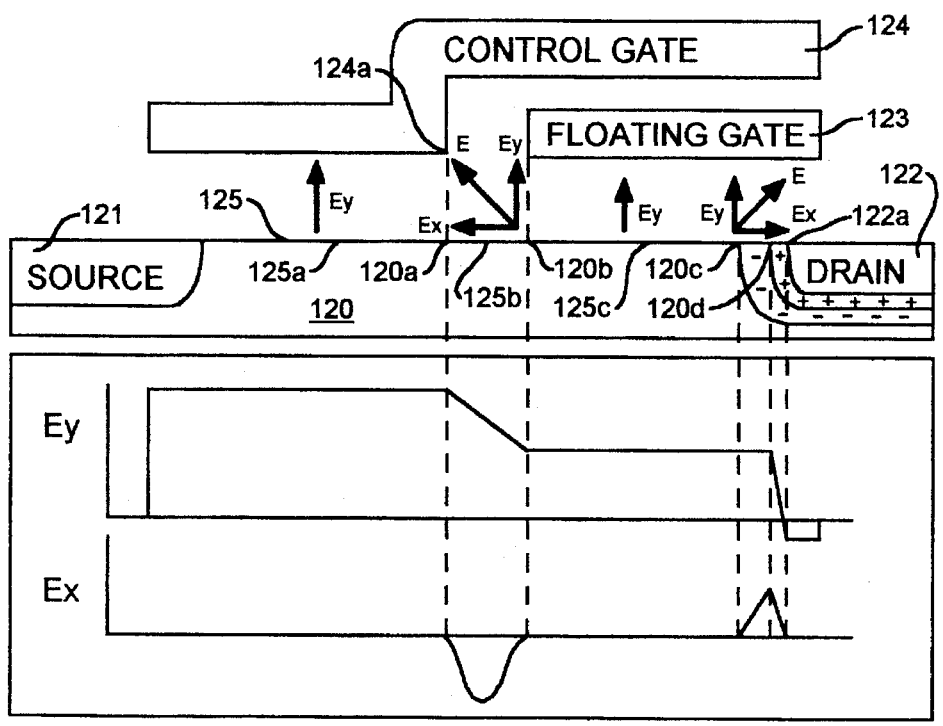
FIG. 12 is an electric field diagram of split gate prior art.

By providing an explanation of programming mechanism in the conventional channel hot electron injection employed in the stacked gate prior art and the split gate prior art, the advantage of the mid channel injection can be appreciated. FIG. 12 is used to explain the channel hot electron injection phenomenon employed in the split gate prior art. In this case, the electron injection occurs at the depletion (pinch-off) region of the drain junction between a point 120c and a point 122a when control gate 124 is applied with 12 volts, source 121 is grounded, and drain 122 is applied with 8 volts. It is assumed that the coupled voltage of floating gate 123 would be about 6 volts if the coupling ratio is 50 percent from control gate 124 to floating gate 123. During the programming, most of the drain-to-source voltage is applied across the depletion region between points 120c and 122a. Electrons entering the depletion region between points 120c and 122a experience both horizontal (Ex) and vertical (Ey) electric forces. First, electrons are accelerated by the horizontal component of the electric field (Ex) to gain high horizontal momentum. Next, accelerated (hot) electrons are diverted upward by the vertical component of the electric field (Ey). Only extremely few (about 0.000005 percent) of accelerated electrons reach floating gate 123 due to the fact that the majority of accelerated electrons lose kinetic energy by the collisions and the scattering in the oxide region.

Even though the mechanism of the conventional channel hot electron injection looks similar to that of the mid channel injection, the former has following drawbacks. First, electrons entering the depletion region between points 120c and 120d are repelled by the negatively charged acceptors (impurity atoms). Therefore, a very high drain voltage is required to compensate such obstacles. Second, electrons flying toward floating gate 123 are suddenly pulled down by the electric field created by drain 122 after they pass through the depletion region between points 120c and 120d. Third, if the overlap between floating gate 123 and drain 122 is small, a large number of flying electrons miss floating gate 123 and fall back to drain 122. Further more, the split gate prior art in FIG. 12 has an opposing horizontal electric field in a middle portion 125b of channel 125. Electrons passing through the channel region between points 120a and 120b are pulled back toward source 121, and a stronger drain voltage is required to compensate that hindrance. The split gate prior an has a worse programming efficiency than the stacked gate prior art due to this reason. In contrast, the mid channel injection has 1,000 to 10,000 times higher carrier injection than the conventional channel hot electron injection and does not use relatively high drain voltage. For these reasons, the mid channel injection cell of the present invention is superior to the split gate cell and the stacked gate cell of prior arts in terms of the programming efficiency.

In contrast with the fact that the mid channel injection uses the middle portion of the channel (116b in FIG. 11) and the conventional channel hot electron injection uses the drain junction area (between 15b and 17a in FIG. 1, and between 120c and 122a in FIG. 12) for the programming, the source side injection employed in the Wu prior an and Mar prior art uses the source junction area (between 30a and 30b in FIG. 3, and between 40a and 40b in FIG. 4) for the programming operation. Although source side injection cells have similar programming efficiencies as the mid channel injection cell, their closeness of carrier injection area to the source can cause previously mentioned false read problem and program disturb problem that causes unselected cells to be programmed undesirably. The mid channel injection cell does not have the false read and the program disturb problems because the carrier injection is done far away from the source region and the sub-threshold current of the select gate is substantially reduced by the use of a fully-characterized standard length gate.

Operation Of The Invention

The programming operation of the mid channel injection EEPROM in accordance with the present invention has been explained in the theory of operation section described above.

Referring now back to FIG. 6, the erase operation and the read operation of the present invention can be explained as follows. For the erase operation, source 61 is grounded, select gate 65 is also grounded, drain 62 is applied with 3.3 volts, and control gate 64 is applied with −12 volts, as an example of bias condition. The potential of floating gate 63 becomes a voltage level lower than −6 volts if the coupling ratio from control gate 64 to floating gate 63 is 50 percent. In this case, a substantially strong electric field is developed between drain 62 and floating gate 63, and the electron tunneling will occur through the oxide from floating gate 63 to drain 62 according to the Fowler-Nordheim tunneling phenomenon. The degree of the erase performance will depend on the voltage of control gate 64 and the overlap area between floating gate 63 and drain 62, when the voltage of drain 62 and the thickness of oxide between floating gate 63 and drain 62 are fixed. Therefore, applying a standard power supply voltage (3.3 volts or 5 volts) instead of a ground potential to drain 62 during the erase will give an advantage of lowering the amount of negative voltage applied to control gate 64 for a desired degree of erase performance, as well as additional advantages of the simplified power supply circuit and not requiting a high voltage endurance junction at drain 62.

The read operation of the present invention may be done in two ways. In a first method, control gate 64 is applied with the same level of voltage as select gate 65 during the read operation. As an example of bias condition, source 61 is grounded, and drain 62 is applied with 3.3 volts, select gate 65 is applied with 3.3 volts, and control gate 64 is applied with 3.3 volts for the read operation. In this bias condition, if floating gate 63 holds a sufficient number of electrons (programmed state) to turn off channel 67c even under the influence of the voltage coupled from control gate 64, then there will be no current flow between source 61 and drain 62. Also, if floating gate 63 does not hold surplus electrons or lacks electrons (erased state), then floating gate 63 will turn on channel 67c under the influence of the voltage coupled from control gate 64 and there will be a current flow through channel 67 between source 61 and drain 62. Middle portion 67b of channel 67 is relatively narrow and is easily turned on by the stray electric field generated by select gate 65 and floating gate 63.

In a second method, the voltage of control gate 64 is a ground potential during the read operation. As an example of bias condition for the read operation, source 61 is grounded, select gate 65 and drain 62 are applied with 3.3 volts, and control gate 64 is grounded. In this bias condition, if floating gate 63 holds a sufficient number of electrons (programmed state) to turn off channel 67c, then there will be no current flow between source 61 and drain 62. Also, if floating gate 63 substantially lacks electrons due to the over-erase (erased state), then floating gate 63 will turn on channel 67c due to the positive charge (lack of electrons) in floating gate 63 and there will be a current flow through channel 67 between source 61 and drain 62. Since middle portion 67b of channel 67 is relatively narrow, the stray electric field generated by select gate 65 and floating gate 63 will easily turn on middle portion 67b of channel 67.

The second method of the read operation described above can be improved by the two separate threshold voltage schemes explained in the sixth embodiment of the present invention shown in FIG. 10. By having a separate p+doped region 100a under select gate 105, the p-type doping level of substrate 100 can be lowered to have a lower threshold voltage for floating gate 103 than the threshold voltage of select gate 105. In this embodiment, the portion of channel 107 under floating gate 103 will be more easily turned on and will conduct better at the same erased level of floating gate 103. This feature of having two separate threshold voltages can be applied to all other embodiments of the present invention without any restriction.

Figure 2:
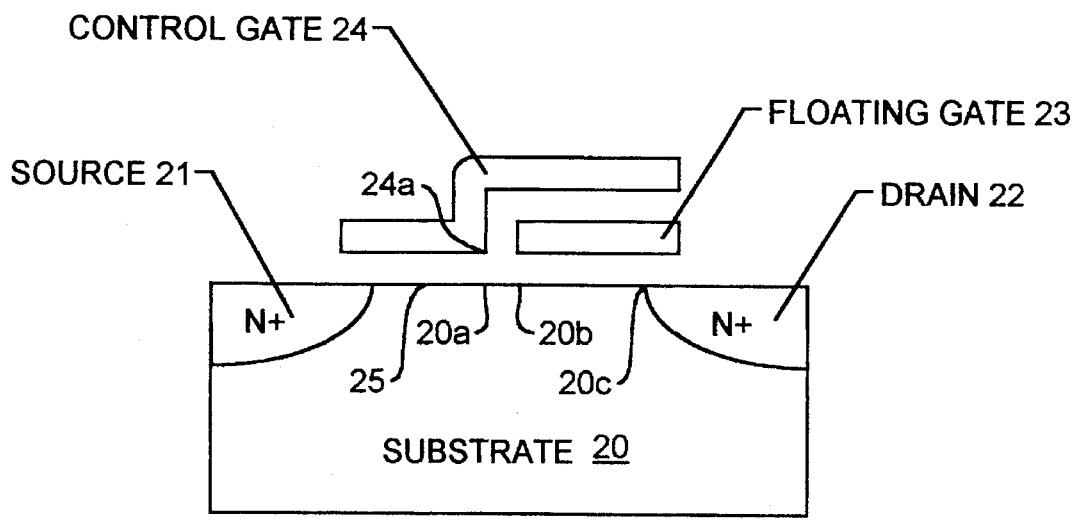
FIG. 2 is an illustration of a split gate prior art cell.

The operational method of the present invention results several advantages over prior arts. The present invention has an advantage of not requiring a high voltage at drain 62 or at source 61 (in FIG. 6) during the program, erase or read operations. In the case of the stacked gate shown in FIG. 1, the program operation requires drain 17 to be supplied with a high voltage at least two times higher than the normal power supply voltage used for the read operation. Furthermore, some of the stacked gate prior arts use even higher voltages at source 16 in order to tunnel out electrons from floating gate 18 during the erase operation. The split gate shown in FIG. 2 also uses a high voltage (presently at least 8 volts) at drain 22 during the program operation. As well known in the art, high voltage junctions are more difficult to make in the sub-micron processes due to the reduced junction breakdown voltages. The process scaling requires a harmonized re-adjustment of the doping concentrations, junction depths, and junction profiles in order to prevent the punch-through and junction breakdown problems when the device geometries such as the channel length and the oxide thickness are shrunk. Traditionally, the process scaling of the EEPROM and EPROM have been more difficult than that of SRAM and DRAM, mainly because the EEPROM and EPROM required high voltage junctions in the memory cells. Since the flash mid channel injection EEPROM device of the present invention do not use high voltages at the drain and source junctions in the memory cells, the process scaling and manufacturing of the present invention will be much easier than those of the stacked gate and split gate prior art devices. The present invention is also more scalable and manufacturable than the source side injection prior arts because the carrier injection area of the present invention is located in the middle of the channel (farther away from the source junction) and therefore the present invention is not as sensitive to the process variations as the source side injection prior art. As previously mentioned, the source side injection prior arts have very severe process sensitivities due to the proximity of the carrier injection area to the source junction. Hence, the manufacturing and scaling of the flash mid channel injection EEPROM devices of the present invention are easier than those of prior art flash EEPROMs, and may be as easy as those of SRAMs and DRAMs.

The use of a standard power supply voltage at the drain (62 in FIG. 6) of the cells in the present invention during the program and erase operations not only eliminates the need of an additional high voltage power supply, but also eliminates the need of a large charge pump for high voltage generation. Presently, the stacked gate and split gate prior arts require an additional 12-volt power supply or relatively large on-chip charge pumps to generate the 8 to 9 volts of high voltages, because large amounts of DC currents will flow between the source and the drain of every cells being programmed. The size of the 12-volt charge pump, which drives the control gates during the programming and the erasing (with polarity inverted), can be made relatively small, since the control gates do not conduct DC currents. Therefore, the mid channel injection device of the present invention can use a single standard voltage power supply (like 5-volt only).

The programming operation of the present invention has an additional advantage of using a standard power supply voltage (presently 5 volts or 3.3 volts) for select gate 65 (in FIG. 6) instead of the very low voltages (1.5 volts or 2 volts) used in the Naruke and Mar prior arts. The use of a standard power supply voltage for select gate 65 eliminates the need of extra circuits for a step-down voltage convertor and simplifies the power supply circuit. It also significantly improves the noise margin of the programming operation as compared to the source side injection prior arts.

Memory Cell Array Structure

Figure 13:
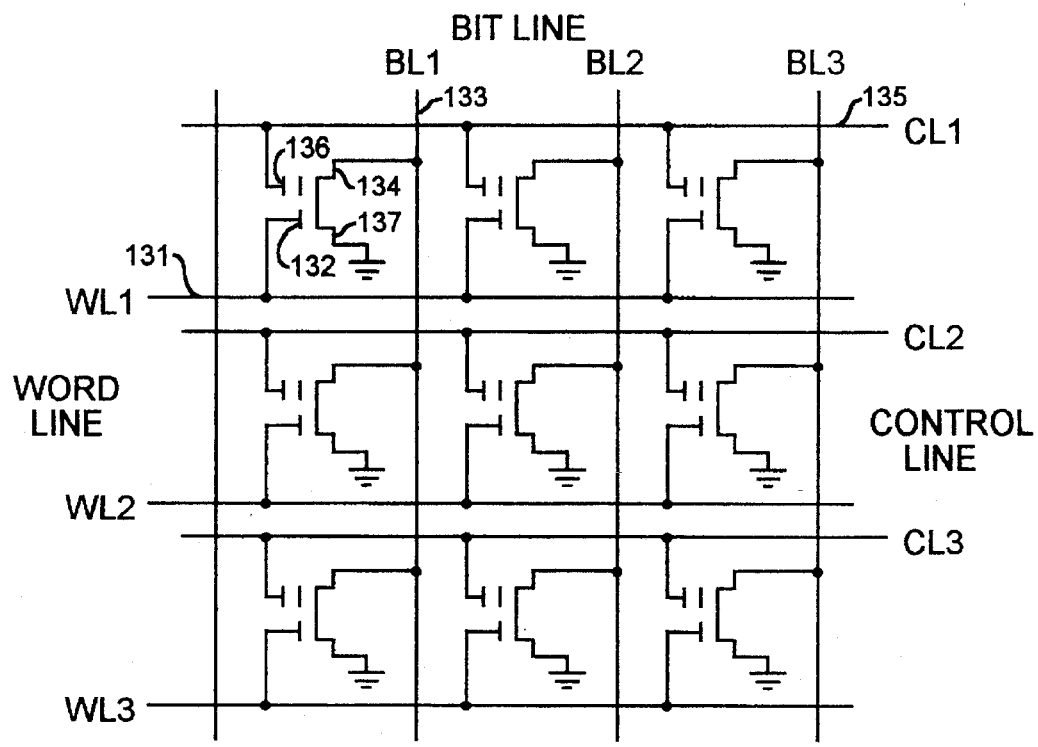
FIG. 13 is a partial schematic diagram of an embodiment of present invention in a flash EEPROM cell array using the NOR array structure.

Although many different methods of interconnecting the flash mid channel injection EEPROM cells may be implemented, certain connection methods increase chip speed at the expense of increased chip (die) size while certain connection methods substantially reduce chip size even when larger size cells are used. Two simple connection methods are illustrated as examples of the possible connections of the mid channel injection cells in accordance with the present invention. p Referring to FIG. 13, a traditional "NOR" type method of array connection is shown. The horizontal word line 131 is connected to select gate 132 of each mid channel injection cell in the first top row. The vertical bit line 133 is connected to drain 134 of each mid channel injection cell in the first left column. The horizontal control line 135 is connected to control gate 136 of each mid channel injection cell in the first top row. Such connections of word lines, bit lines, and control lines are repeated in both horizontal and vertical directions in the array of mid channel injection cells. A common line is connected to source 137 of all mid channel injection cells in the array to supply the ground potential.

This NOR-type array connection method requires one metal contact for each connection of the bit line and the drain of each cell, thus wasting significant space between cells and increasing the chip size. But this type of array connection method has a read access speed relatively faster than other array connection methods and also has the random access capability. Therefore, the flash mid channel injection EEPROM devices employing the NOR-type array connection are suitable for the BIOS code storage in personal computers and for the execute-in-place code storage in other digital equipments.

Figure 14:
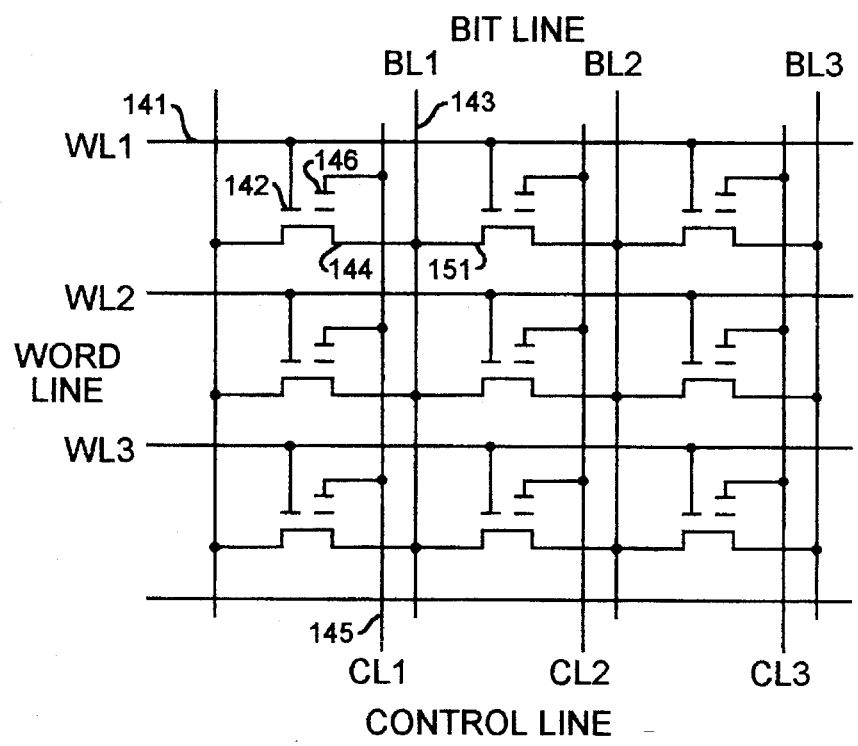
FIG. 14 is a partial schematic diagram of another embodiment of present invention in a flash EEPROM cell array using the virtual ground array structure.

Referring to FIG. 14, a "virtual ground" type method of array connection is shown. The horizontal word line 141 is connected to select gate 142 of each mid channel injection cell in the first top row. The vertical bit line 143 is connected to drain 144 of each mid channel injection cell in the first left column and is also connected to source 151 of each mid channel injection cell in the second middle column. The vertical control line 145 is connected to control gate 146 of each mid channel injection cell in the first left column. Such connections of word lines, bit lines, and control lines are repeated both in horizontal and vertical directions in the array of mid channel injection cells.

The virtual ground type of array connection method utilizes the "buried diffusion" connections between each bit line and the source or the drain of each cell. Since a pair of columns of the cells shares one bit line, and multiple of cells can be connected to one metal contact, this type of array connection method drastically reduces the chip size (down to 60 percent in a best case) and significantly improves the yield. In other words, a higher density flash EEPROM device can be manufactured at a lower cost by still utilizing old design rules and old fabrication equipments. However, the read access speed is relatively slow and the source-drain interchange circuit is required in this type of array connection method. Therefore, the flash mid channel injection EEPROM devices employing the virtual ground array connection method are suitable for high density solid state storages which can replace hard disk drives in computers and other digital equipments.

Thus, several embodiments of flash EEPROM cells employing mid channel injection have been disclosed along with the method of manufacturing, a new theory of operation, operations of the invention, memory cell array structures, and advantages of the present invention. Advantages of the present invention over the prior arts include no over-erase problem, faster erase speed, higher efficiency of carrier injection, faster programming speed, no false read problem, no program disturb problem, use of single voltage power supply, simpler charge pump and high voltage generation circuit, not using high voltages at the drain and source, ease of scaling and manufacturing, better noise margin, and insensitivity to mask mis-alignment and process variations.

While several embodiments of the present invention have been described, many alterations and modifications to the present invent may be made by those skilled in the art without departing from the scope and the concepts of the present invention, and will be obvious to those skilled in the art upon reference to the descriptions herein. References to the details of the preferred embodiments are not intended to limit the scope of the appended claims which recites only those features regarded as essential to the present invention. Accordingly, the scope of this invention, as recited in the appended claims, shall include all equivalents of the elements and features of the present invention.

What is claimed is:

1. A flash electrically erasable and programmable read only memory device comprising a plurality of memory cells disposed in a two-dimensional array, a plurality of row address lines, a plurality of column address lines, a plurality of control lines, and means for connecting said plurality of memory cells to said plurality of row address lines, said plurality of column address lines, and said plurality of control lines, wherein one of said plurality of memory cells is selected by a combination of one of said plurality of row address lines and one of said plurality of column address lines, and further wherein each of said plurality of memory cells comprises a single transistor, said single transistor comprising:

a semiconductor substrate of first conductivity type;

a source region and a drain region each of a second conductivity type spaced apart across a surface of said substrate with a channel region therebetween;

a floating gate of conductive material positioned over but insulated from said channel region and said drain region, said floating gate self-aligned with respect to said drain region and extending over a portion of said channel region by a first predetermined dimension between said drain region and a first point near the middle of said channel region;

a control gate of conductive material positioned over but insulated from said floating gate, said control gate having each edge aligned with each adjacent edge of said floating gate;

a select gate of conductive material positioned over a portion of said channel region between said source region and a second point near the middle of said channel region but insulated from said source region, said channel region, said floating gate and said control gate, said select gate having a first edge self-aligned with respect to said source region and a second edge located at said second point near the middle of said channel region, said select gate having a second predetermined dimension between said first edge and said second edge, said select gate having substantially no sub-threshold leakage current, whereby substantially no leakage current flows when said select gate is turned off, said second predetermined dimension of said select gate being substantially equal to said first predetermined dimension of said floating gate, said select gate and said floating gate being spaced apart by a third predetermined dimension, whereby an electric field for carrier injection is created on a substantially middle portion of said channel region by an edge of said floating gate located at said first point near the middle of said channel region when a first predetermined potential is applied to said control gate; and a carrier acceleration passage comprising said substantially middle portion of said channel region located under an insulating material disposed between said select gate and said floating gate, said carrier acceleration passage having said third predetermined dimension defined by a predetermined thickness of said insulating material, whereby carriers are accelerated to gain substantial horizontal momentum by a horizontal component of said electric field and then diverted upward by a vertical component of said electric field to reach said floating gate;

wherein each of said plurality of memory cells is programmed by injection of carriers accelerated through said carrier acceleration passage onto said floating gate when said first predetermined potential is applied to said control gate, a second predetermined potential is applied to said drain region, a third predetermined potential is applied to said select gate and a fourth predetermined potential is applied to said source region.

2. The memory device of claim 1, further including a spacer of insulating material positioned between said select gate and the stack of said control gate and said floating gate, whereby said third predetermined dimension of said carrier acceleration passage is easily adjusted by the thickness of said spacer.

3. The memory device of claim 1, further including a first extension of conductive material extending from said second edge of said select gate to the top surface of said control gate, said first extension insulated from said control gate and said floating gate, said first extension minimally overlapping the top surface of said control gate by a fourth predetermined dimension, whereby said select gate is insensitive to mis-alignment between said select gate and the stack of said control gate and said floating gate.

4. The memory device of claim 2, further including a second extension of conducting material extending from said second edge of said select gate to the top surface of said control gate, said second extension insulated from said control gate and said floating gate, said second extension minimally overlapping the top surface of said spacer and the top surface of said control gate by a fifth predetermined dimension, whereby said select gate is insensitive to misalignment between said select gate and the stack of said control gate and said floating gate.

5. The memory device of claim 4, further including a third extension of conducting material extending upward from said first edge of said select gate in a horizontally opposite direction of said second extension so as to form a T-shape when the thickness of said select gate is thicker than a half of said second predetermined dimension.

6. The memory device of claim 1, wherein said portion of said channel region between said source region and said second point near the middle of said channel region is implanted with substantially different amount of dopants than other portion of said channel region, whereby a first threshold voltage of said select gate is made substantially different from a second threshold voltage of said floating gate.

7. The memory device of claim 1, wherein said floating gate has an angled edge facing said carder acceleration passage.

8. The memory device of claim 1, wherein said select gate has an angled edge facing said carrier acceleration passage.

9. The memory device of claim 1, wherein said first conductivity type is p-type, said second conductivity type is n-type, said carders are electrons, and wherein each of said plurality of memory cells is erased by tunneling of carriers from said floating gate to said drain region when a fifth predetermined potential is applied to said control gate and a sixth predetermined potential is applied to said drain region.

10. The memory device of claim 1, wherein said connection means includes a plurality of word lines, a plurality of bit lines, a plurality of control lines, and a common line, and wherein each of said plurality of word lines extending in a first direction and being electrically connected to each of adjacent said select gate of said memory cells adjacently located in a row that extends in said first direction, each of said plurality of bit lines extending in a second direction that is substantially perpendicular to said first direction and being electrically connected to each of adjacent said drain of said memory cells adjacently located in a column that extends in said second direction, each of said plurality of control lines extending in said first direction and being electrically connected to each of adjacent said control gate of said memory cells adjacently located in a row that extends in said first direction, said common line being connected to each said source of said plurality of memory cells, whereby each of said plurality of memory cells is randomly accessed at a relatively high speed by each combination of one of said plurality of word lines and one of said plurality of bit lines.

11. The memory device of claim 1, wherein said connection means includes a plurality of word lines, a plurality of control lines, and a plurality of bit lines, and wherein each of said plurality of word lines extending in a first direction and being electrically connected to each of adjacent said select gate of said memory cells adjacently located in a row that extends in said first direction, each of said plurality of control lines extending in a second direction that is substantially perpendicular to said first direction and being electrically connected to each of adjacent said control gate of said memory cells adjacently located in a column that extends in said second direction, each of said plurality of bit lines extending in said second direction, being electrically connected to each of adjacent said source of said memory cells located in a first adjacent column that extends in said second direction, and also being electrically connected to each of adjacent said drain of said memory cells located in a second adjacent column that extends in said second direction, whereby twice the number of said memory cells may share one bit line in order to reduce the chip size.

* * * * *

UNITED STATES PATENT AND TRADEMARK OFFICE
CERTIFICATE OF CORRECTION

PATENT NO. : 5,455,792
DATED : October 3, 1995
INVENTOR(S) : Yong-Wan Yi

It is certified that error appears in the above-identified patent and that said Letters Patent is hereby corrected as shown below:

Column 1,
Line 44, change "an" to -- art --.

Column 3,
Line 19, change "an" to -- art -- for the third word.
Line 19, change "an" to -- art -- for the eighth word.
Line 24, change "an" to -- art --.

Column 4,
Lines 51 and 61, change "an" to -- art --.

Column 6,
Line 63, add a period -- . -- after "injection".

Column 10,
Line 56, change "coveting" to -- covering --.

Column 11,
Lines 33 and 38, change "carder" to -- carrier --.
Lines 35 and 39, change "carders" to -- carriers --.
Line 66, change "romped" to -- formed --.

Column 12,
Line 19, change "fight" to -- right --.

Column 13,
Lines 47 and 60, change "an" to -- art --.

Column 16,
Line 31, remove "p" after "invention".

UNITED STATES PATENT AND TRADEMARK OFFICE
CERTIFICATE OF CORRECTION

PATENT NO.    : 5,455,792
DATED         : October 3, 1995
INVENTOR(S)   : Yong-Wan Yi It is certified that error appears in the above-identified patent and that said Letters Patent is hereby corrected as shown below:

Column 19,
Line 24, change "carder" to -- carrier --.
Line 30, change "carders" to -- carriers --.

Signed and Sealed this

Twenty-second Day of April, 2003

JAMES E. ROGAN
*Director of the United States Patent and Trademark Office*